(12) United States Patent
Furuta et al.

(10) Patent No.: US 7,973,371 B2
(45) Date of Patent: Jul. 5, 2011

(54) SEMICONDUCTOR INTEGRATED CIRCUIT DEVICE INCLUDING STATIC RANDOM ACCESS MEMORY HAVING DIFFUSION LAYERS FOR SUPPLYING POTENTIAL TO WELL REGION

(75) Inventors: Hiroshi Furuta, Kanagawa (JP); Junji Monden, Kanagawa (JP); Ichiro Mizuguchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 385 days.

(21) Appl. No.: 12/285,166

(22) Filed: Sep. 30, 2008

(65) Prior Publication Data

US 2009/0091964 A1 Apr. 9, 2009

(30) Foreign Application Priority Data

Oct. 5, 2007 (JP) ................................. 2007-262024

(51) Int. Cl.
 *H01L 31/119* (2006.01)
(52) U.S. Cl. ........ 257/393; 257/369; 257/380; 257/385; 257/E29.255
(58) Field of Classification Search .................. 257/369, 257/380, 385–393, E29.255
 See application file for complete search history.

(56) References Cited

U.S. PATENT DOCUMENTS

| 6,653,695 B2 * | 11/2003 | Oyamatsu ..................... 257/393 |
| 6,677,649 B2 * | 1/2004 | Osada et al. .................. 257/379 |

FOREIGN PATENT DOCUMENTS

| JP | 10-178110 | 6/1998 |
| JP | 2001-28401 | 1/2001 |
| JP | 2003-23112 | 1/2003 |
| JP | 2005-347360 | 12/2005 |
| JP | 2006-339480 | 12/2006 |
| JP | 2007-19166 | 1/2007 |

* cited by examiner

*Primary Examiner* — Dung A. Le
(74) *Attorney, Agent, or Firm* — McGinn IP Law Group, PLLC

(57) ABSTRACT

A static random access memory (SRAM) cell includes a first well region of a first conductivity type, a second well region of the first conductivity type, formed in a location different from a location where the first well region is formed, and a third well region of a second conductivity type, which is located between the first well region and the second well region. The memory cell further includes a first tap diffused layer of the first conductivity type for supplying a potential to the first well region, a second tap diffused layer of the first conductivity type for supplying the potential to the second well region, the first and second tap diffused layers being arranged substantially on a diagonal line in the layout of the SRAM cell, and a metal interconnection connected to the first and second tap diffused layers, the metal interconnection passing on the third well region in the SRAM cell.

16 Claims, 18 Drawing Sheets

○ WELL CONTACT

○ WELL CONTACT

SEMICONDUCTOR INTEGRATED CIRCUIT DEVICE INCLUDING STATIC RANDOM ACCESS MEMORY HAVING DIFFUSION LAYERS FOR SUPPLYING POTENTIAL TO WELL REGION

BACKGROUND OF THE INVENTION

1. Field of the Invention

A semiconductor integrated circuit device according to the present invention relates particularly to a semiconductor integrated circuit device including SRAM (Static Random Access Memory) cells arranged in an array.

2. Description of Related Art

These years, products (for example, a single-unit SRAM product and a MPU) each manufactured by mounting SRAM cells on a semiconductor integrated circuit device have been widely in use. For the purpose of increasing the number of SRAM cells mounted thereon, attempts are made to form the gate electrodes of the respective transistors and the diffused layers constituting each SRAM cell in as simple a shape as possible, and thus to miniaturize the elements. Examples of such an SRAM cell are disclosed by Patent Documents 1 to 6. Each of the SRAM cells respectively disclosed by Patent Documents 1 to 6 has a cell shape long in the word-line direction. By contrast, there are SRAM cells each having a cell shape long in the bit-line direction. For this reason, in the following descriptions, SRAM cells each having a cell shape long in the word-line direction will be referred to as "horizontally-long cells" whereas SRAM cells each having a cell shape long in the bit-line direction will be referred to as "vertically-long cells." Patent Documents 1 to 6 disclose their respective horizontally-long cells each in which an n-well region is interposed between the p-well regions.

Patent Document 3 discloses that the well regions are supplied with their well potentials through a silicide layer. Patent Document 4 discloses that the well regions are supplied with their well potentials through their butted contacts, respectively. According to Patent Document 4, such a potential supply scheme prevents a latch-up. Patent Documents 5 and 6 disclose that the source regions of the driver transistors formed in the different p-well regions are connected together, respectively. This connecting scheme makes the source potentials of the transistors formed in the remote locations equal to each other, respectively. This makes it possible to stabilize the operations of the driver transistors.

[Patent Document 1] Japanese Patent Application Publication No. Hei. 10-178110
[Patent Document 2] Japanese Patent Application Publication No. 2001-28401
[Patent Document 3] Japanese Patent Application Publication No. 2003-23112
[Patent Document 4] Japanese Patent Application Publication No. 2005-347360
[Patent Document 5] Japanese Patent Application Publication No. 2006-339480
[Patent Document 6] Japanese Patent Application Publication No. 2007-19166

SUMMARY OF THE INVENTION

According to Patent Document 1 to 6, however, potentials are supplied to the different p-well regions through the different passages, respectively. As a result, the p-well regions are electrically connected together through resistance components. For this reason, in some cases, a potential difference may occur between the p-well regions formed in their respective different locations even in the same cell. Referring to the equivalent circuit diagrams, descriptions will be provided for resistance components of MOS transistors (hereinafter referred to as "MOSFETs") and well resistance components.

As an example, an equivalent circuit diagram of an SRAM cell in a layout disclosed by Patent Document 1 is shown in FIG. 17. According to Patent Document 1, as shown in FIG. 17, multiple cells use common ground potential interconnections. The ground potential interconnection for a driver transistor DTr1 and the ground potential interconnection for a driver transistor DTr2 are provided as different interconnections. These two ground potential interconnections are connected together for each k cells (or once for each k cells). As a result, the p-well region of the driver transistor DTr1 and the p-well region of the driver transistor DTr2 are connected together through the interconnection resistance Rmk/2 of each of the common ground potential interconnections (or ground potential interconnection resistances of the k cells) depending on the number k of cells supplied with their ground potentials through the common ground potential interconnections, via resistances rv, and contact resistances rc of each of the ground potential interconnections. In the drawing, a resistance rmc is negligible.

However, the interconnection resistance of a cell varies depending on what bit in a series from the ground potential supplying location the two p-wells in the cell correspond to. In the case where two ground potential taps are provided for each k cells, the number of the interconnection resistances is k/2 at maximum due to the operation of the two taps. In addition, between the p-well region of the driver transistor DTr1 and the p-well region of the driver transistor DTr2, the substrate resistance Rpsub exists depending on the distance between the two p-well regions. In the case of the example shown in FIG. 17, the resistance values has a large-to-small relationship of rv<rc<<Rpsub. Incidentally, as the number k increases, the resistance value of the ground potential interconnection resistance Rmk becomes larger (for example, rc≦Rmk/2) so that the resistance value thereof is not negligible.

In addition, as another example, an equivalent circuit diagram of an SRAM cell described in Patent Document 2 is shown in FIG. 18. According to Patent Document 2, tap regions (locations to which Vbn are connected correspond to the tap regions in FIG. 4 of Patent Document 2) each for supplying a well potential to p-well regions are provided for each multiple SRAM cells. As a result, the p-well regions formed in their different locations in each SRAM cell are supplied with their well potentials from their different tap regions, respectively. In addition, the tap regions are supplied with their well potentials from a common ground potential interconnection.

As shown in FIG. 18, each p-well region in each SRAM cell according to Patent Document 2 is supplied with the ground potential through a certain number of well equivalent resistances Rp, the certain number depending on the number of SRAM cells corresponding to a single tap region. In addition, the substrate resistance Rpsub exists between the p-well regions formed in their respective different locations in each SRAM cell. In the case of the example shown in FIG. 18, the resistance values has a large-to-small relationship of rc<<Rp<Rpsub. Incidentally, many SRAM cells are usually connected to the single ground potential interconnection. As a result, the interconnection resistance Rmx is too large in resistance value (for example, rc≦Rmx) to be negligible.

In the cases of Patent Documents 1 to 6, as described above, when each SRAM cell includes the p-well regions formed in their respective different locations therein, the resistance exists between the p-well regions in their respective different locations. Moreover, among the resistances, the substrate resistance Rpsub has several hundreds of Ω to 1 kΩ. In other words, when a current flows through the above-described resistances, the potential difference occurs between the p-well regions formed in their respective different locations. Each MOSFET changes its characteristic due to the well potential. For this reason, in the case where the potential difference occurs between the wells due to the resistances between the wells, the characteristics of the respective paired transistors (for example, the two driver transistors) expected to operate in pair in the same cell become different from each other. Once the characteristics of the respective paired transistors become different from each other, the difference causes problems such as decrease in yields of each SRAM cell, reduction in operation margin of the SRAM cell, and deterioration in resistance of the SRAM cell against a soft error which occurs due to a radioactive ray.

Particularly in a case where a radioactive ray falls incident on the semiconductor substrate, the potentials of the respective p-wells exhibit complicated changes in a time ranging from several picoseconds to several nanoseconds. As a result, even though, from a viewpoint of a direct current, a ground potential continues to be supplied to the two p-well regions in the same manner as the potential is supplied thereto before the radioactive ray falls incident thereon, a potential difference occurs between the two p-well regions due to influence of parasitic resistances of the respective interconnections and parasitic capacitances from a viewpoint of an alternating current. In sum, in the case of the prior art, once a radioactive ray falls incident on a semiconductor substrate, a potential difference between two p-well regions poses a serious problem.

An exemplary aspect of the present invention is a semiconductor integrated circuit device including static random access memory (SRAM) cells each comprising: a first p-well region in which a first transfer transistor and a first driver transistor are formed; a second p-well region in which a second transfer transistor and a second driver transistor are formed; and an n-well region which is located between the first p-well region and the second p-well region in a plan view thereof, and in which a first load transistor and a second load transistor are formed, the first load transistor being connected between a power supply potential interconnection and the first driver transistor, and the second load transistor being connected between the power supply potential interconnection and the second driver transistor. In the semiconductor integrated circuit device, each SRAM cell includes: a first tap p-diffused layer for supplying a potential to the first p-well region; and a second tap p-diffused layer for supplying the potential to the second p-well region. In the semiconductor integrated circuit device, the first and second tap p-diffused layers are arranged almost symmetrical with respect to the center of a layout of the SRAM cell, as well as the first and second tap p-diffused layers are connected to each other with a first metal interconnection over the n-well region in the SRAM cell.

Another exemplary aspect of the present invention is a semiconductor integrated circuit device including static random access memory (SRAM) cells each including: a first well region formed of a first conductivity type of semiconductor; a second well region which is formed of the first conductivity type of semiconductor, and which is formed in a location different from a location where the first p-well region is formed; and a third well region which is located between the first well region and the second well region in a plan view thereof, and which is formed of a second conductivity type of semiconductor. In the semiconductor integrated circuit device, each SRAM cell includes: a first tap diffused layer of the first conductivity type for supplying a potential to the first well region; and a second tap diffused layer of the first conductivity type for supplying the potential to the second well region. In the semiconductor integrated circuit device, the first and second tap diffused layers are arranged almost symmetrical with respect to the center of a layout of the SRAM cell, as well as the first and second tap diffused layers are connected to each other with a first metal interconnection, a part of which passes on the third well region in the SRAM cell.

In the case of the semiconductor integrated circuit device according to the present invention, the p-well regions formed in their respective different locations in the same cell are connected to each other with the metal interconnection traversing over the cell. Specifically, the p-well regions formed in their respective different locations in the same cell are connected to each other with the metal interconnection whose resistance is very small. In the case of the semiconductor integrated circuit device according to the present invention, this causes substantially no potential difference to occur between the p-well regions formed in their respective different locations in the same cell.

The semiconductor integrated circuit device according to the present invention is capable of increasing the stability of the operation of each SRAM cell, and is capable of increasing the soft error resistance of each SRAM cell.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

The present invention relates to a semiconductor integrated circuit device including SRAM cells. Although the following detailed descriptions will be provided for SRAM cells, the present invention is applicable to a wide range of semiconductor integrated circuit devices each including SRAM cells, regardless of how the SRAM cells are packaged in each semiconductor integrated circuit device. In the following descriptions, a circuit which stores one bit of data is simply termed as an SRAM cell, and that in which SRAM cells are arranged in matrix is termed as an SRAM array.

Figure 1:
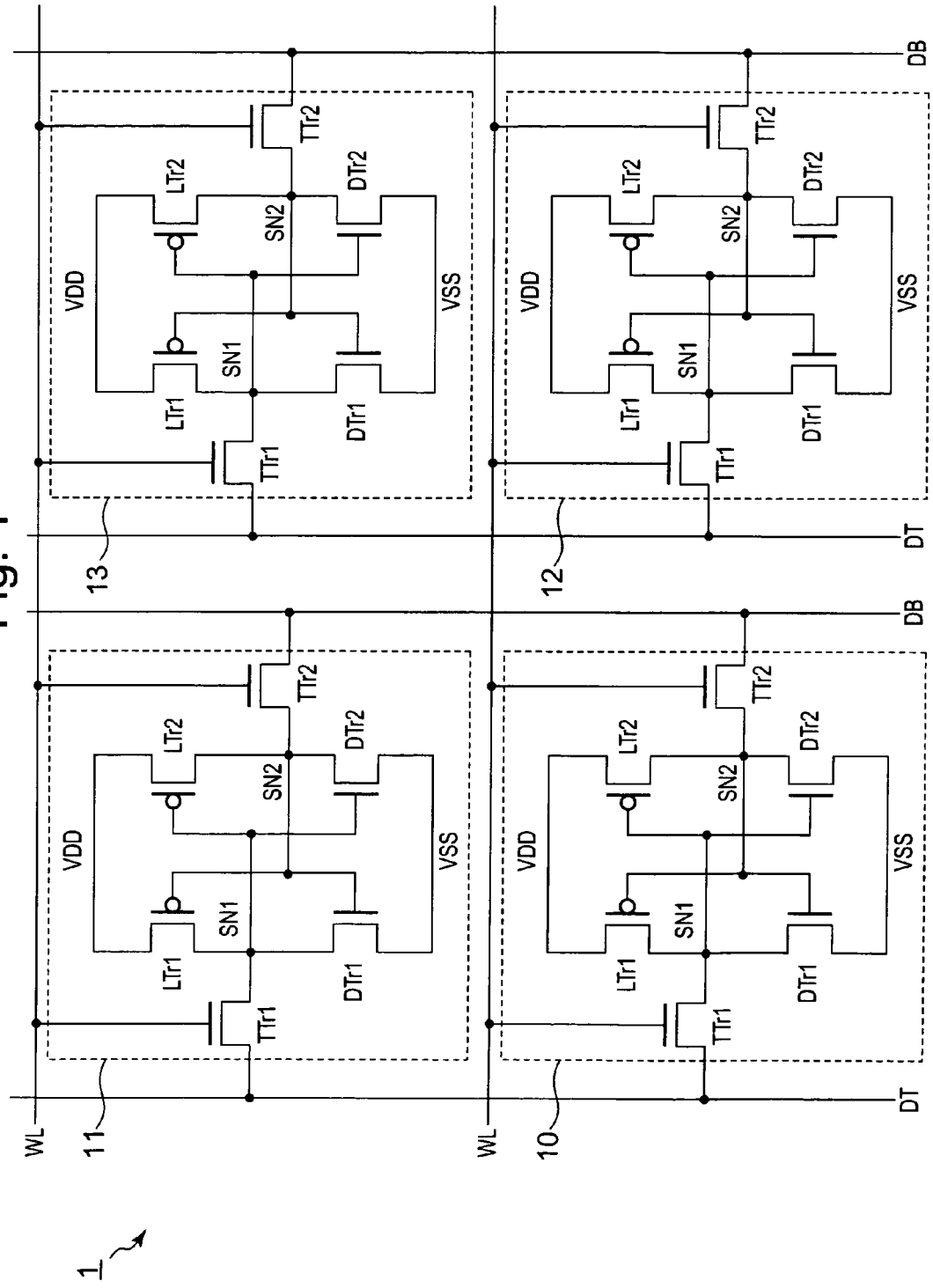
FIG. 1 is a circuit diagram of an SRAM array according to a first exemplary embodiment.

FIG. 1 shows a circuit diagram of an SRAM array 1 according to a first embodiment of the present invention. As shown in FIG. 1, SRAM cells are arranged in matrix in the SRAM array. An example of the SRAM array shown in FIG. 1 illustrates four SRAM cells out of multiple SRAM cells arranged therein. Each SRAM cell stores one bit of data. In the SRAM array 1, bit line pairs each including a bit line DT and a bit line DB, and word lines Wt used to control the reading and writing operations of the SRAM cells, are arranged in such a way as to intersect each other. In the SRAM array 1, multiple SRAM cells are connected to each bit line pair. In addition, multiple SRAM cells are connected to each word line WL. In the following descriptions, a direction in which the word lines extend is termed as a "first direction" or an "X direction." A direction in which the bit lines extend is termed as a "second direction" or a "Y direction." The first and second directions have a relationship in which the first and second directions are almost orthogonal to each other.

SRAM cells 10 to 14 have the same configuration. For this reason, the SRAM cell 10 is chosen as an example representative of the SRAM cells 10 to 13, and the configuration of the SRAM cell 10 will be described. The SRAM cell 10 includes a first and second transfer transistors (for example, transfer transistors TTr1, TTr2), a first and second driver transistors (for example, driver transistors DTr1, DTr2), as well as a first and second load transistors (for example, load transistors LTr1, LTr2). In the case of the present embodiment, the transfer transistors TTr1, TTr2 and the driver transistors DTr1, DTr2 are each configured of an NMOS transistor (hereinafter referred to as an "NMOSFET"), whereas the load transistors LTr1, LTr2 are each configured of a PMOS transistor (hereinafter referred to as a "PMOSFET").

The load transistor LTr1 configured of PMOSFETT and the driver transistor DTr1 configured of NMMOSFET are connected to each other in series between a power supply potential interconnection VDD and a ground potential interconnection VSS, and thus constitute a first inverter. The load transistor LTr2 configured of PMOSFET and the driver transistor DTr2 configured of NMOSFET are connected to each other in series between the power supply potential interconnection VDD and the ground potential interconnection VSS, and thus constitute a second inverter. In addition, the drain of the load transistor LTr1 and the drain of the driver transistor DTr1 are connected to each other, and their connecting point constitutes a first storage node SN1. The drain of the load transistor LTr2 and the drain of the driver transistor DTr2 are connected to each other, and their connecting point constitutes a second storage node SN2. The transfer transistor TTr1 configured of NMOSFET is connected between the bit line DT and the first storage node SN1. In addition, the gate of the transfer transistor TTr1 is connected to the word line WL. The transfer transistor TTr2 configured of NMOSFET is connected between the bit line DB and the second storage node SN2. Furthermore, the gate of the transfer transistor TTr2 is connected to the word line WL. The SRAM cell 10 inputs data from the bit line DT to the first storage node SN1, and outputs data to the bit line DT from the first storage node SN1, through the transfer transistor TTr1. Moreover, the SRAM cell 10 inputs data from the bit line DB to the second storage node SN2, and outputs data to the bit line DB from the second storage node SN2, through the transfer transistor TTr2.

Figure 2:
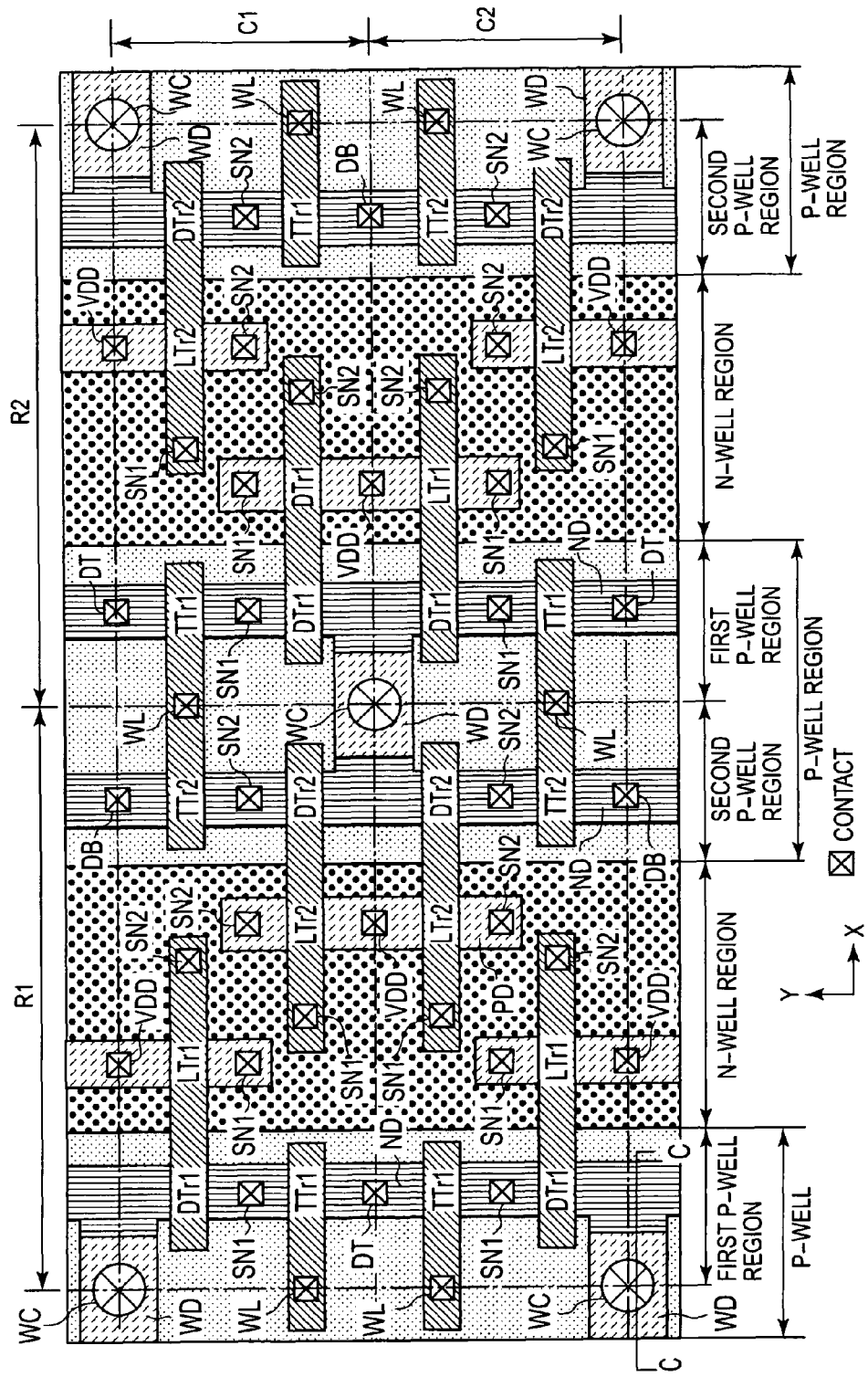
FIG. 2 is a schematic diagram of a layout of the SRAM array according to the first exemplary embodiment.

Next, FIG. 2 shows a schematic diagram of a layout corresponding to the SRAM array 1 shown in FIG. 1. The layout shown in FIG. 2 is a layout shown in a plan view of the SRAM array 1. In addition, the layout shown in FIG. 2 illustrates a total of four SRAM cells including two SRAM cells in the X direction×two SRAM cells in the Y direction. The reference numerals denoting the gates of the transistors shown in FIG. 2 correspond to the reference numerals denoting the transistors constituting the SRAM cells shown in FIG. 1, respectively. In FIG. 2, reference numerals R1, R2 denote row numbers of the SRAM cells arranged in lattice, whereas C1, C2 denote column numbers of the SRAM cells arranged in lattice.

As shown in FIG. 2, the SRAM cell includes: p-well regions which are formed respectively in different locations; and an n-well region which is interposed between the p-well regions. The p-well regions formed in the different locations are referred to as a "first p-well region" and a "second p-well region," respectively. One p-well region in the SRAM cell 10 is formed in a continuum region shared by another p-well region in another SRAM cell that is arranged contiguous to the SRAM cell 10 in the X direction. In addition, the first and second p-well regions as well as the n-well region all are formed as such a way to extend in the Y direction.

The driver transistor DTr1 and transfer transistor TTr1 are formed in the first p-well region. An active region ND functioning as the source, drain, and channel region of the driver transistor DTr1, as well as the source, drain, and channel region of the transfer transistor TTr1 is configured of an n-semiconductor. The active region ND in the SRAM cell 10 is formed as a region continued to another active region ND in another SRAM cell arranged contiguous to the SRAM cell 10 in the Y direction. The active region ND is formed in a straight line extending in the Y direction. A part of the active region ND, which part adjoins a tap p-diffused layer, is formed convex toward the tap p-diffused layer. The optimizing of the distance d between this convex part and the end face of the gate electrode makes it possible to reduce the influence of the convex part on the fabrication accuracy. The inclusion of the convex part in the active layer ND makes it possible to widen the n-semiconductor region in which the source of the driver transistor is formed. This makes it possible to reduce the influence of the tap p-diffused layer configured by doping the p-well region with p-impurities on the n-diffused layer source region of the driver transistor configured of NMOSFET. Incidentally, "butted diffused layers" refer to a structure in which such two diffused layers having different conductivity types contact each other, and one of the two diffused layers is a diffused layer for supplying a potential to the other. In addition, a "butted contact" refers to a structure of a contact in which a contact is laid across the two diffused layers.

On the active region ND, contacts are formed depending on the respective nodes, each of which the source or drain of a corresponding transistor is connected to. In the drawings, each contact is given a reference numeral denoting a node or interconnection which is connected to the contact as the reference numeral denoting the contact. Out of the contacts in the SRAM cell, the contact connected to the bit line DT and the contact connected to the ground potential interconnection are arranged in the boundary between the SRAM cell 10 and its neighboring SRAM cell which are contiguous to each other in the Y direction, and are used by the two SRAM cells. The gate of the driver transistor DTr1 is formed in such a way as to be integrated with the gate of the load transistor LTr1 formed in the n-well region. The gate of the transfer transistor TTr1 in the SRAM cell 10 is formed in such a way as to be integrated with the gate of the transfer transistor TTr2 in a cell SRAM cell which is contiguous to the SRAM cell 10 in the X direction. A contact connected to the word line WL is formed in the gate of each transfer transistor TTr1.

The tap p-diffused layer WD is provided there for the purpose of supplying the p-well region with a well potential (the ground potential in the case of the present embodiment) from the tap p-diffused layer WD. The tap p-diffused layer WD is formed in a region laid over SRAM cells, one of which adjoins the others respectively in the X, Y and diagonal directions. In other words, the tap p-diffused layer WD is formed in a region laid over four SRAM cells. In the case of the present embodiment, the tap p-diffused layer WD is arranged in a way that the intersection point of the boundaries of the SRAM adjoining cells is located in the almost same position as the center of the tap p-diffused layer WD is located. Furthermore, the tap p-diffused layer WD is formed in such a way as to contact active layers in which the sources of the driver transistors of the neighboring SRAM cells are formed. A well contact WC is formed above the tap p-diffused layer WD.

The driver transistor DTr2 and the transfer transistor TTr2 are formed in the second p-well region. The arrangement of the transistors and the tap p-diffused layer WD in the second p-well region is symmetrical to the arrangement of the transistors and the tap p-diffused layer WD in the first p-well region with respect to the center of the SRAM cell. As a result, the tap p-diffused layers WD are arranged on one diagonal line in the SRAM cell. In the following descriptions, the tap p-diffused layer WD in the first p-well region will be referred to as a "first p-diffused layer WD," and the tap p-diffused layer WD in the second p-well region will be referred to as a "second p-diffused layer WD," for the convenience's sake. The gate of the driver transistor DTr2 is formed in such a way as to be integrated with the gate of the load transistor LTr2. The gate of the transfer transistor TTr2 is formed in such a way as to be integrated with the gate of the transfer transistor TTr1 of the neighboring SRAM cell. A contact connecting to the word line WL is formed in the gate of the transfer transistor TTr2.

In the case of this exemplary embodiment, the first tap p-diffused layer WD and the second tap p-diffused layer WD are arranged in the respective locations which are almost symmetrical with respect to the center of the layout of the single SRAM cell (that is, almost (substantially) on one diagonal line of the SRAM cell in the case of the present embodiment). In addition, each of the first tap p-diffused layer WD and the second tap p-diffused layer WD is arranged in a way that the intersection point of the boundaries of the four neighboring SRAM adjoining cells corresponding to the diffused layer WD almost (substantially) coincides with the center of the tap p-diffused layer WD. When, as described above, all of the tap p-diffused layers WD are arranged in the SRAM array 1 in which the SRAM cells are arranged in matrix, it is possible to make the area of each tap p-diffused layer WD as largest as possible while checking increase in the total area of the SRAM array 1. The increase in the area of each tap p-diffused layer makes it possible to decrease the resistance value of its corresponding p-well. Simultaneously, it is possible to prevent malfunction which would otherwise occur due to the positional displacement between each well contact and its corresponding tap p-diffused layer WD.

The load transistors LTr1, LTr2 are formed in the n-well region. The load transistors LTr1, LTr2 are formed on their respective active regions PD formed of a p-semiconductor. The active region PD on which the load transistor LTr1 is formed in the SRAM cell 10 and the active region PD on which the load transistor LTr1 is formed in an SRAM cell contiguous to the SRAM cell 10 in the Y direction are formed in such a way as to be integrated together. In addition, the active region PD on which the load transistor LTr2 is formed in the SRAM cell 10 and the active region PD on which the load transistor LTr2 is formed in a SRAM cell contiguous to the SRAM cell 10 in the Y direction are formed in such a way as to be integrated together.

A contact connected to the first storage node SN1 is formed in a part of the active region PD on which the load transistor LTr1 is formed, which part corresponds to the drain of the load transistor LTr1. A contact VDD connected to the power supply potential interconnection is formed in another part of the active region PD on which the load transistor LTr1 is formed, which part corresponds to the source of the load transistor LTr1. A contact connected to the second storage node SN2 is formed in a part of the active region PD on which the load transistor LTr2 is formed, which part corresponds to the drain of the load transistor LTr2. A contact VDD connected to the power supply potential interconnection is formed in another part of the active region PD on which the load transistor LTr2 is formed, which part corresponds to the source of the load transistor LTr2. The contact VDD connected to the power supply potential interconnection connected to the load transistor LTr1 is formed in the boundary between the SRAM cell 10 and an SRAM cell which are contiguous to each other, and is thus commonly used by the contiguous SRAM cells. The contact VDD connected to the power supply potential interconnection connected to the load transistor LTr2 is formed in the boundary between the SRAM cell 10 and another SRAM cell which are contiguous to each other, and is thus commonly used by the contiguous SRAM cells. Furthermore, a contact connected to the second storage node SN2 is formed in a gate of the load transistor LTr1, whereas the contact connected to the first storage node SN1 is formed in the gate of the load transistor LTr2.

Figure 3:
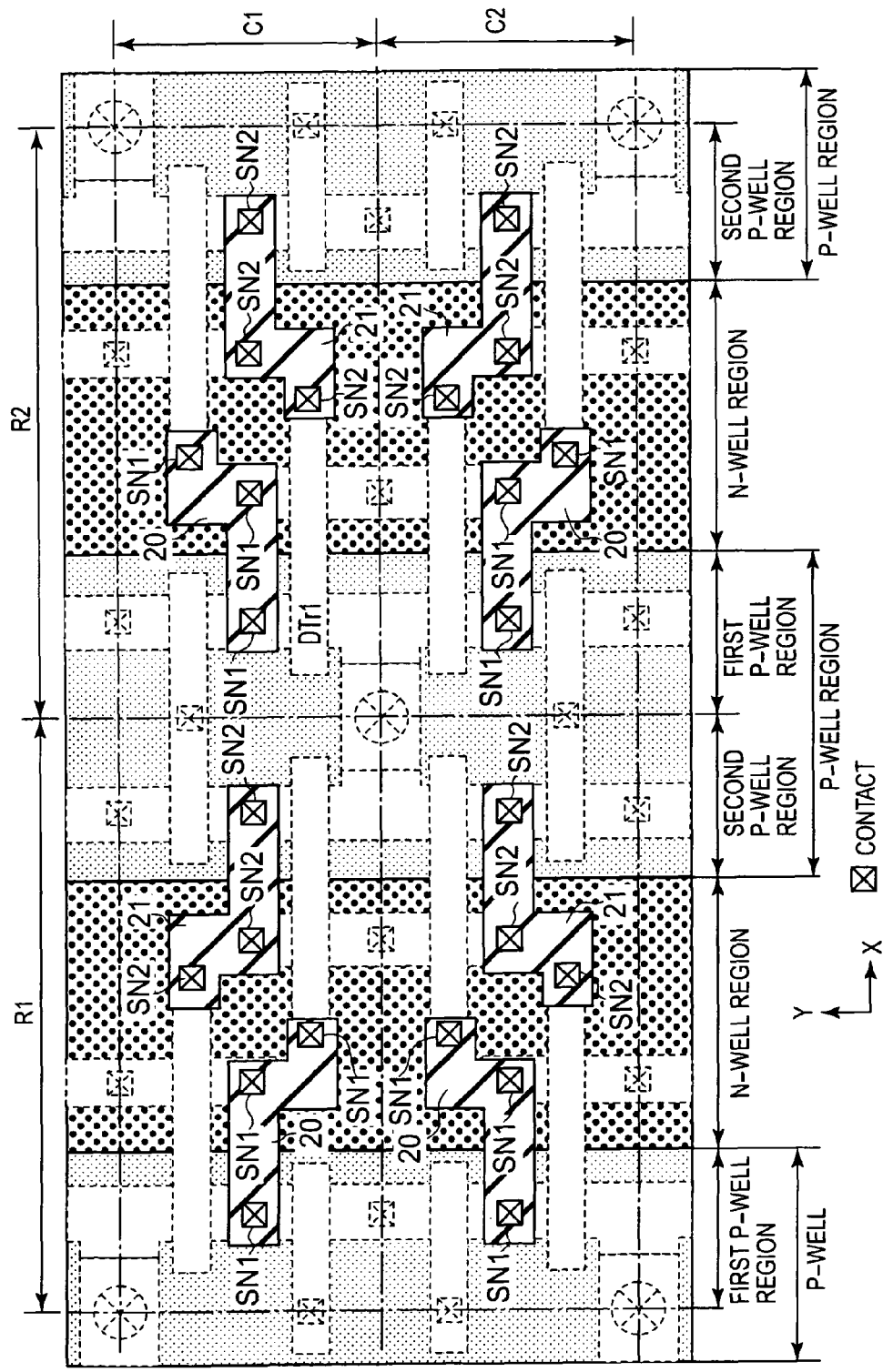
FIG. 3 is a schematic diagram of layouts of the respective interconnections each connecting its corresponding storage nodes in the SRAM array 1 according to the first exemplary embodiment.

In the above-described SRAM cell, metal interconnections each connecting their corresponding nodes to each other are formed. Descriptions will be provided hereinbelow for how the metal interconnections are arranged. First of all, FIG. 3 shows a layout of a metal interconnection connecting the first storage nodes SN1 together and a metal interconnection connecting the second storage nodes SN2 together. Incidentally, in FIG. 3, the outlines of each transistor shown in FIG. 2 are shown with broken lines.

Figure 4:
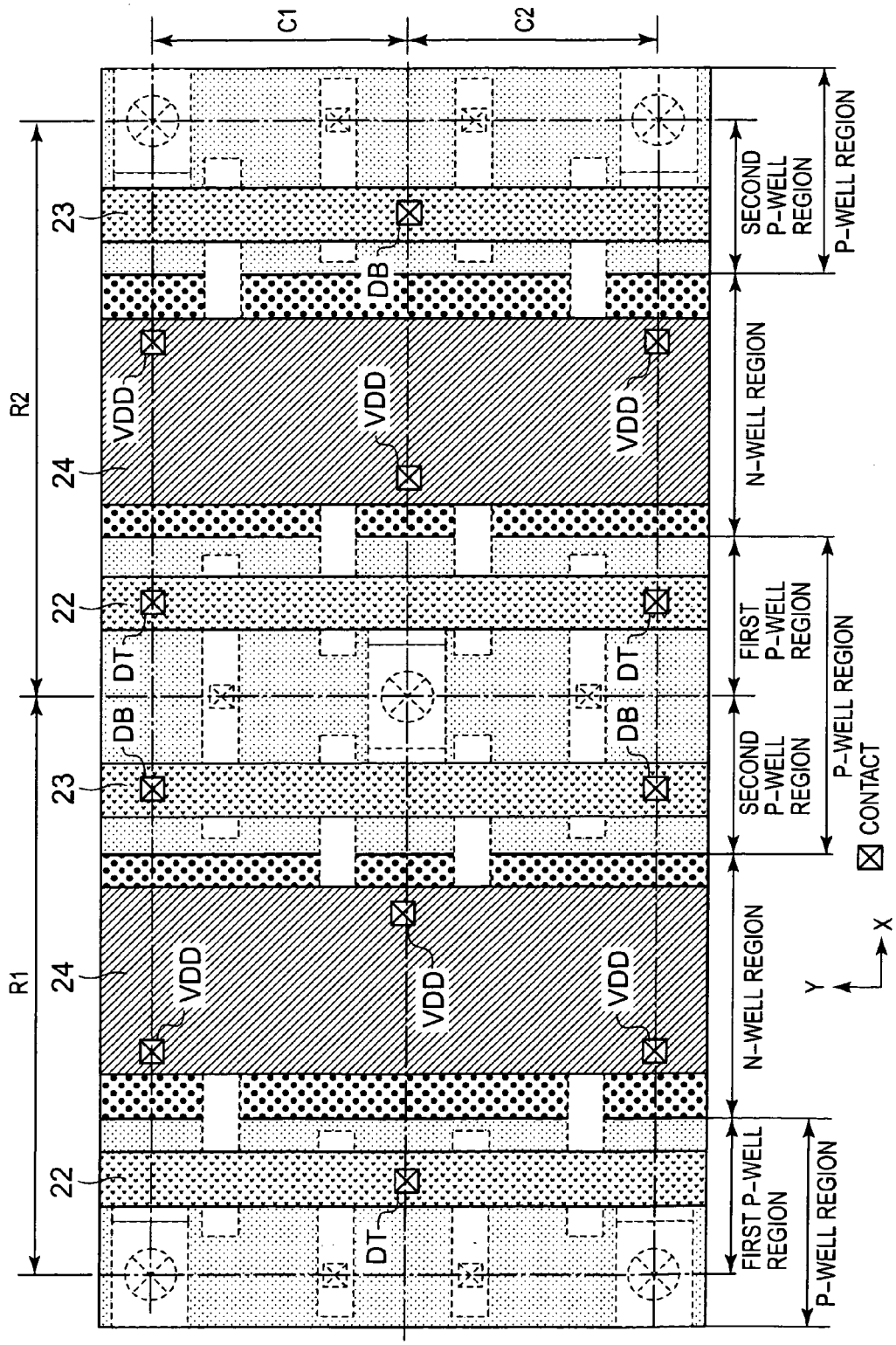
FIG. 4 is a schematic diagram of layouts each of bit interconnections and power supply potential interconnections in the SRAM array 1 according to the first exemplary embodiment.

Next, FIG. 4 shows the layouts respectively of a metal interconnection used as the bit line DT (hereinafter referred to as a "first bit interconnection 22"), a metal interconnection used as the bit line DB (hereinafter referred to as a "second bit interconnection 23") and a metal interconnection used as the power supply potential interconnection (hereinafter referred to as a "power supply potential interconnection 24"). As shown in FIG. 4, the first bit interconnection 22 is arranged in a location on the active region ND in the first p-well region, and is arranged in a straight line extending in the Y direction. The second bit interconnection 23 is arranged in a location on the active region ND in the second p-well region, and is arranged in a straight line extending in the Y direction. Each of the first bit interconnection 22 and the second bit interconnection 23 is used commonly by multiple SRAM cells. The power supply potential interconnection 24 is arranged in a location covering the active region PD arranged in the n-well region, and is arranged in a straight line extending in the Y direction. In addition, the power supply potential interconnection 24 is used commonly by multiple SRAM cells arranged in the Y direction.

Figure 5:
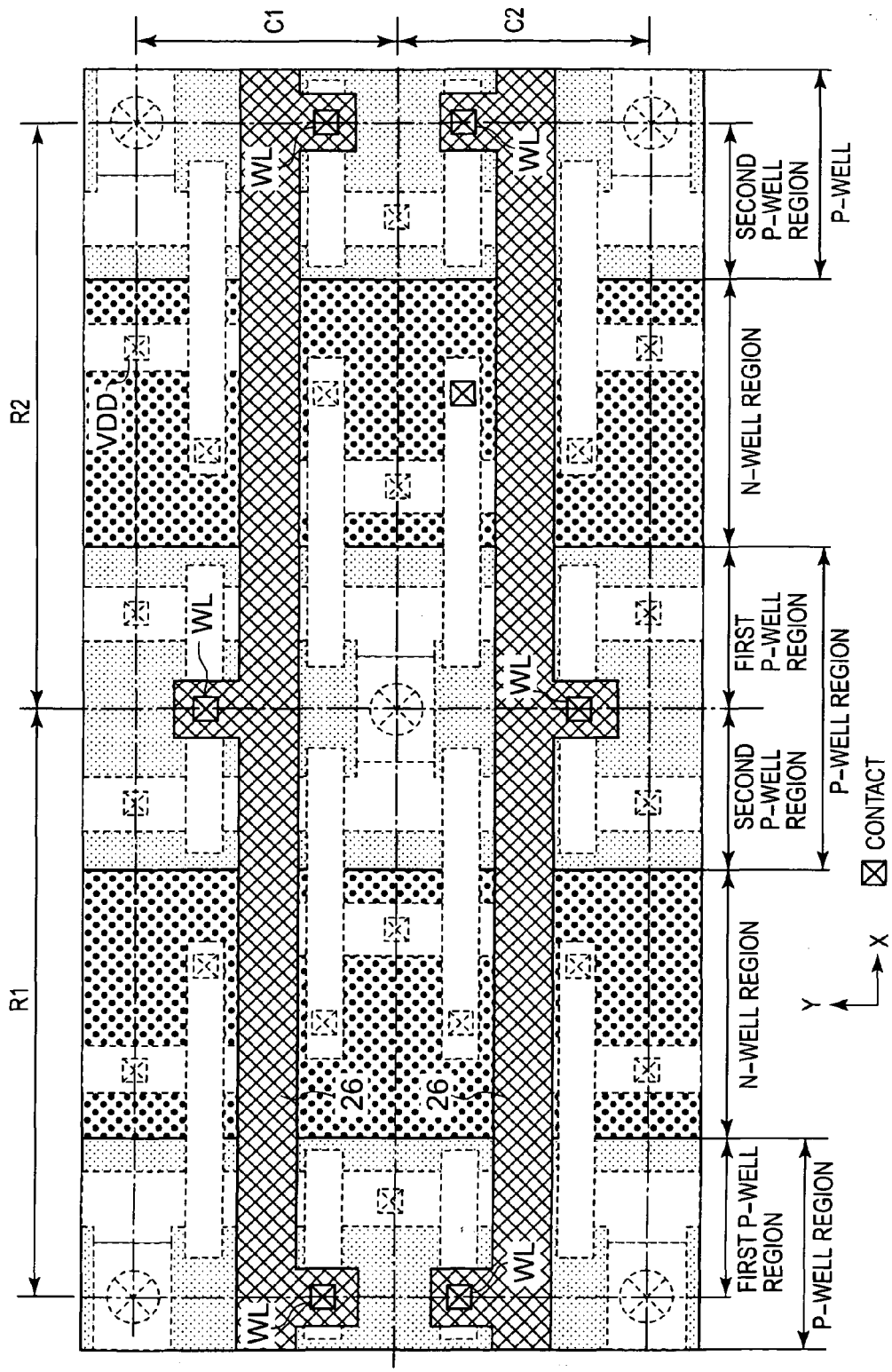
FIG. 5 is a schematic diagram of a layout of ground potential interconnections in the SRAM array 1 according to the first exemplary embodiment.

FIG. 5 shows the layout of a metal interconnection used as the word line WL (hereinafter referred to as a "word interconnection 26"). As shown in FIG. 5, the word line 26 includes a linear portion which extends in the X direction above the n-well region, and which is laid across multiple SRAM cells. In the case of the present embodiment, the linear portion of the word interconnection 26 is arranged around the center line of each corresponding SRAM cell in the Y direction.

Figure 6:
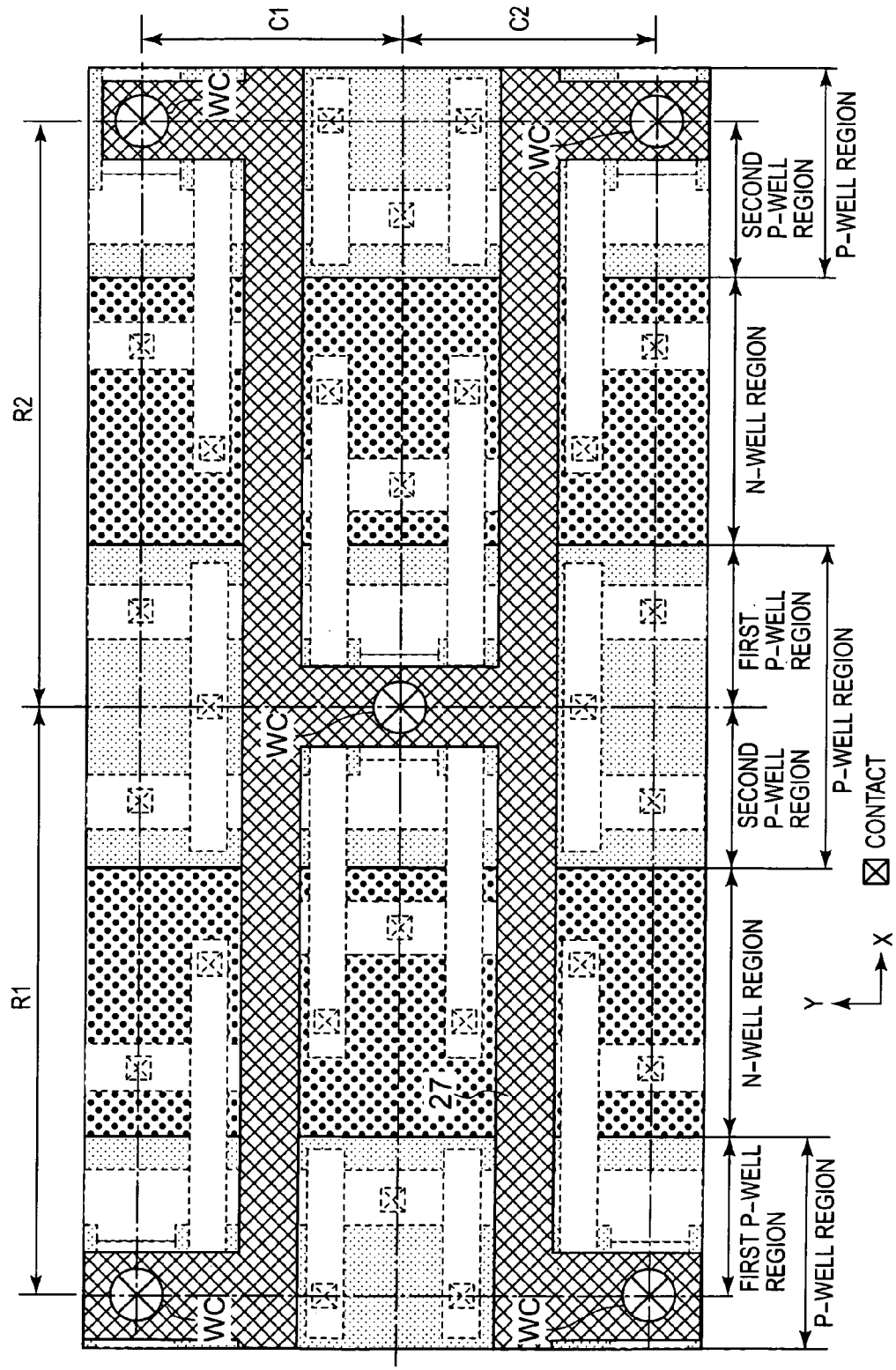
FIG. 6 is a schematic diagram of a layout of word interconnections in the SRAM array 1 according to the first exemplary embodiment.

In the case of the present embodiment, the SRAM cell includes a first metal interconnection (or a well potential interconnection 27) connecting together the well contacts WC arranged in the same SRAM cell in addition to the above-described metal interconnections. This well potential interconnection 27 supplies a ground potential to the p-well regions. FIG. 6 shows a layout of the well potential interconnection 27. As shown in FIG. 6, the well potential interconnection 27 extends in the X direction above the n-well region, and is shaped like a letter L in two end portions in the SRAM cell. Thus, the well potential interconnection 27 connects together the well contacts WC which are arranged on one diagonal line in the same SRAM cell.

Furthermore, in the case of the present embodiment, above the n-well region, the well potential interconnection 27 is arranged around the center line of the SRAM cell in the Y direction. Furthermore, a part of the well potential interconnection 27, which part is located above the n-well region, and the word interconnection 26 constituting the word line WL have a relationship in which the part of the well potential interconnection 27 overlaps the word interconnection 26 in the perpendicular direction. Thereby, the two p-wells arranged in the same SRAM cell are connected together through a very small interconnection resistance.

In the case of the exemplary embodiment, the ground potential is supplied to the source of the driver transistor and the tap p-diffused layer WD. The source of the driver transistor is supplied with the potential through a silicide layer. For the purpose of explaining how the silicide layer is used to supply the source potential to the driver transistor, FIG. 7 shows a cross-sectional schematic diagram of the semiconductor integrated circuit device taken along the C-C line of FIG. 2.

Figure 7:
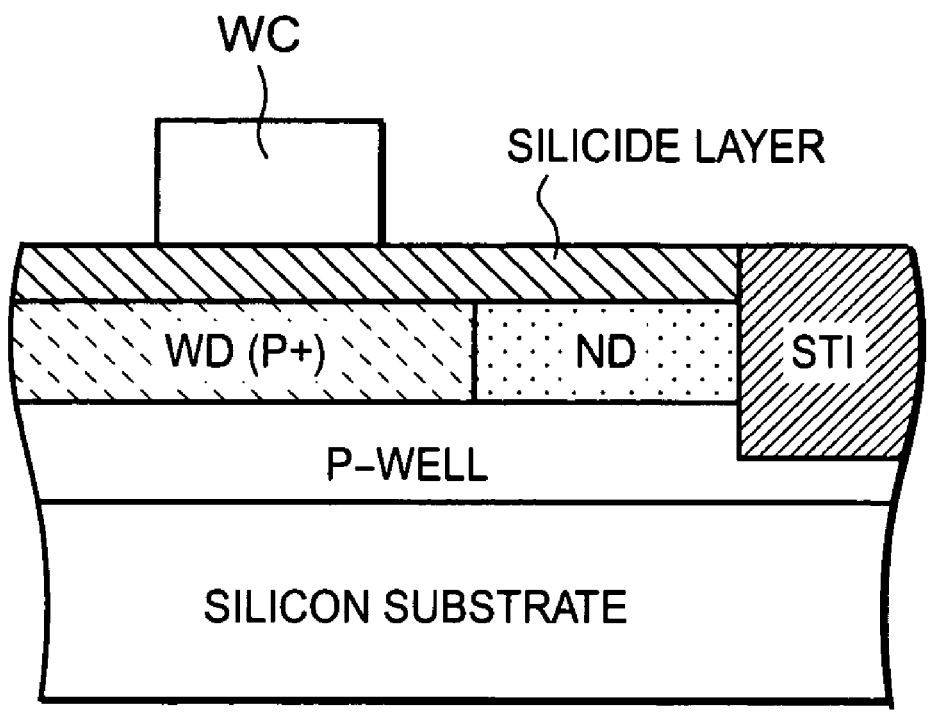
FIG. 7 is a cross-sectional schematic diagram of a semiconductor integrated circuit device taken along the C-C line of FIG. 2.

In the case of this semiconductor integrated circuit device, as shown in FIG. 7, the tap p-diffused layer WD and the n-active region ND are formed in the p-well region. The concentration level of the impurities implanted in the tap p-diffused layer WD is set higher than the concentration level of the impurities implanted in the p-well region. The n-active region ND corresponds to the source of the driver transistor. The silicide layer is formed on the tap p-diffused layer WD and the n-active region ND. The driver transistor can be supplied with the source potential from the p-well potential interconnection connected to the tap p-diffused layer WD in the p-well region, because the resistance of the silicide layer is low. In FIG. 7, "P-well" denotes a well region configured of NMOSFET; "STI" denotes an element separation layer; and the substrate region is a region constituting a silicon substrate for MOSFETs each formed of a p-semiconductor, for example.

Here, by giving an example, descriptions will be provided for the layer structure including the interconnections used in the exemplary embodiment. The materials for each metal interconnection and the process sequence with which the layers are formed can be changed whenever deemed necessary. Hereinafter, an example will be given in accordance with the process sequence. Interconnections 20 for the nodes SN1 and interconnections 21 for the nodes SN2 in each SRAM cell shown in FIG. 3 are each a metal interconnection made of tungsten. The bit lines 22, 23 and the power supply potential interconnection 24 shown in FIG. 4 are each an interconnection made of aluminum, and are formed in a single step. Thereafter, the p-well interconnection 27 shown in FIG. 6 is an interconnection made of aluminum. The word lines 26 shown in FIG. 5 are each an interconnection made of aluminum.

Figure 8:
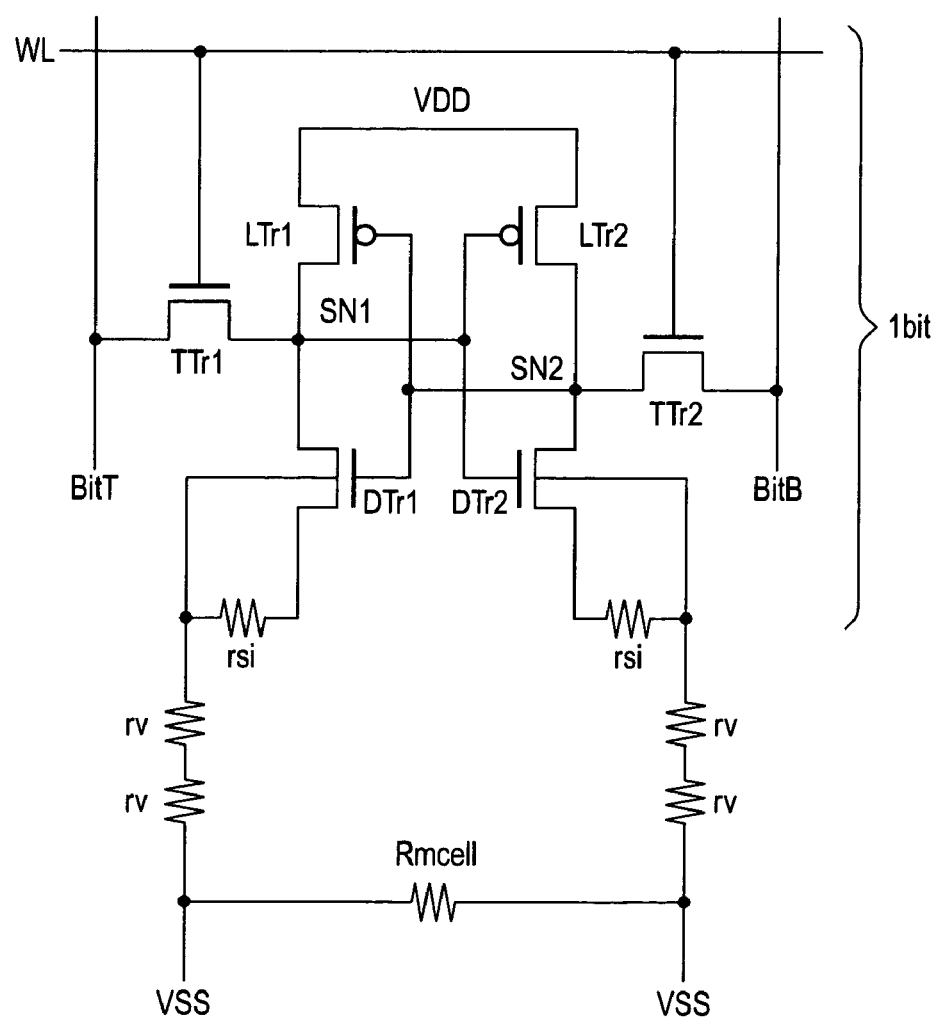
FIG. 8 is an equivalent circuit diagram of an SRAM cell according to the first exemplary embodiment.

Next, FIG. 8 shows an equivalent circuit diagram of the SRAM cell fabricated by use of the layouts according to the exemplary embodiment. In the case of the exemplary embodiment, as shown in FIG. 8, the p-well region in which the driver transistor DTr1 is located and the p-well region in which the driver transistor DTr2 is located are connected to each other through resistances rv of the respective contacts (or vias) each connecting its corresponding interconnection layers and a resistance Rmcell of the well potential interconnection 27 traversing on the SRAM cell. In the equivalent circuit shown in FIG. 8, each p-well region is connected to the well potential interconnection 27 with two vias being interposed in between. The ground potential is supplied to the two p-well regions through the well potential interconnection 27. The source potential is supplied to the driver transistor DTr1 and the driver transistor DTr2 from the p-well potential interconnection 27 through the silicide resistance rsi. The resistance value of the silicide resistance rsi is small. For this reason, the silicide resister rsi has almost no influence on the operations of the two respective driver transistors.

The resistance values respectively of the resistances rv of the vias and the resistance value of the resistance Rmcell of the well potential interconnection 27 are negligibly small in comparison with the resistance value Rpsub of the substrate region. In addition, because the well potential interconnection does nothing but traverse the inside of the SRAM cell, the well potential interconnection is very short in length in comparison with a related counterpart of the well potential interconnection, and the interconnection resistance of the well potential interconnection is very small in comparison with the interconnection resistance of the related counterpart of the well potential interconnection under the related interconnection scheme.

For this reason, the exemplary embodiment is capable of making the potentials of the p-well regions formed in the different locations substantially equal to each other. Moreover, because the interconnection resistance and parasitic capacitance between the two p-well regions are small, the exemplary embodiment is capable of stabilizing the potentials of the two respective p-well regions from a viewpoint of the alternating current. In other words, even in a case where the potential changes in either of the two p-well regions due to the influence of a radioactive ray or the like, the present embodiment is capable of minimizing the difference between the potentials of the two respective p-well regions. Specifically, the exemplary embodiment is capable of increasing the soft error resistance.

In some cases, a laminated structure (termed as a triple-well structure) including a substrate region, a deep n-well region and a well region is fabricated under the regions where the respective transistors are formed as countermeasures against a soft error, and for the purpose of preventing carries from being injected into an SRAM cell region from a peripheral circuit (carrier injection). When such a triple-well structure is employed, the p-well regions respectively arranged in the right and left end portions in the SRAM cell are completely separated from each other by the deep n-well region. For this reason, when the triple-well structure is employed, the potential difference is apt to occur between the right and left p-well regions. Even in this case, the exemplary embodiment is capable of connecting the right and left p-well regions together with a lower resistance in the SRAM cell, and thus of making the potentials respectively of the right and left p-well regions equal to each other.

Figure 9:
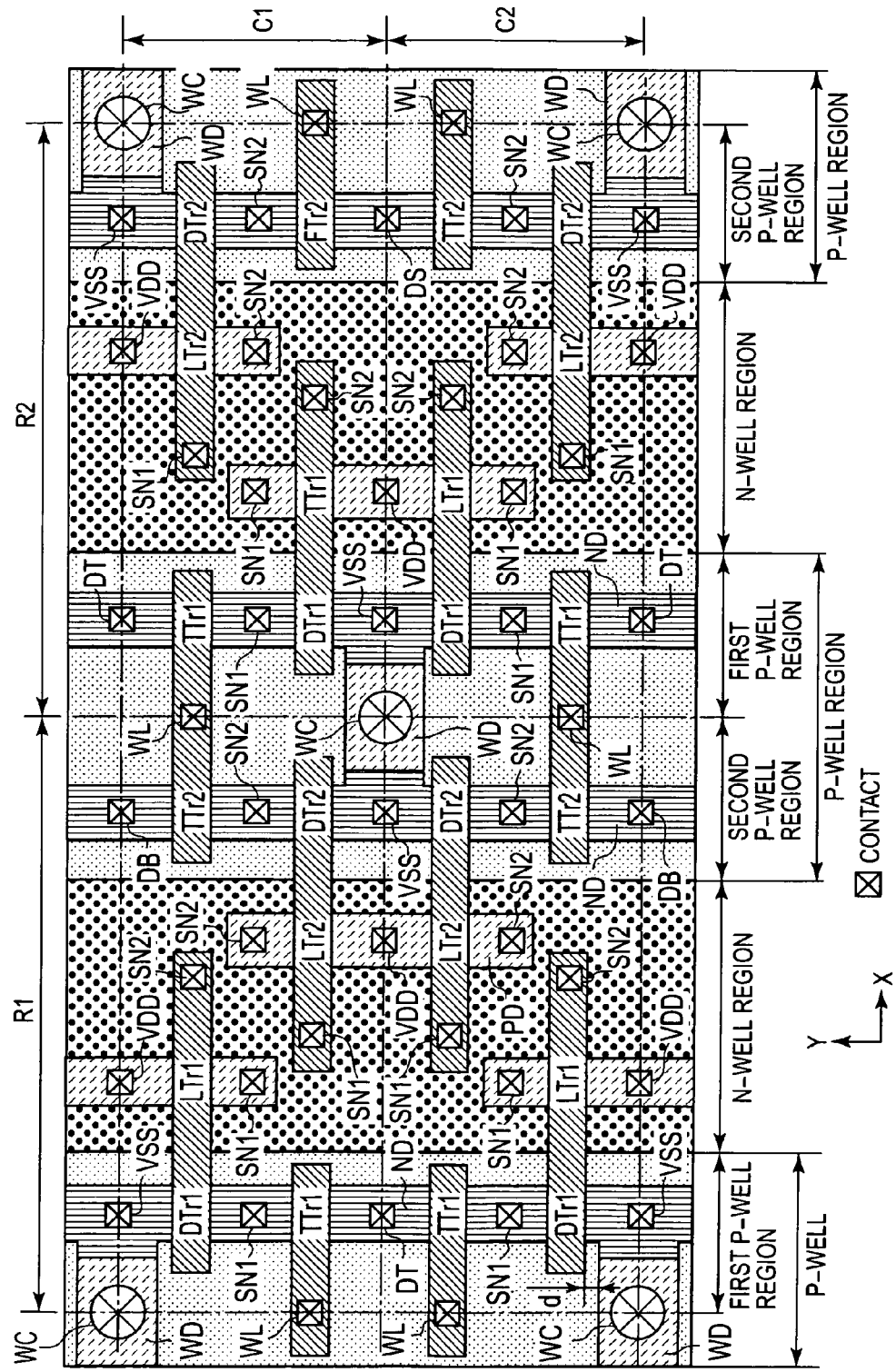
FIG. 9 is a schematic diagram of a layout in which, respectively, a contact is provided in a diffused layer functioning as the sources of its corresponding driver transistors in the SRAM array 1 according to the first exemplary embodiment.
Figure 10:
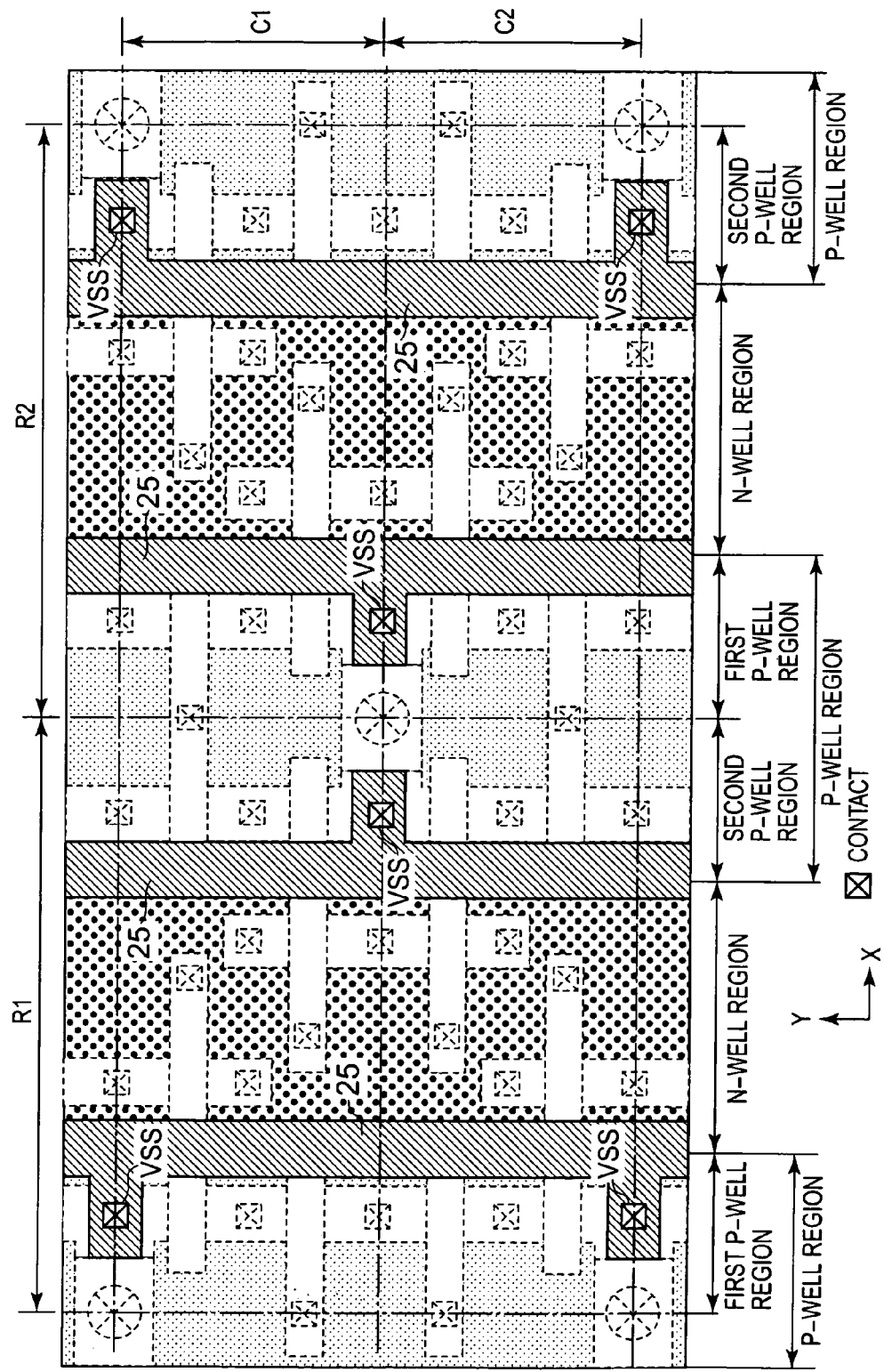
FIG. 10 is a schematic diagram of a layout of ground potential interconnections connected to the sources shown in FIG. 9 in the first exemplary embodiment.

FIG. 9 shows another example of the first exemplary embodiment in which the ground potential is directly supplied to the source of each driver transistor. The layout shown in FIG. 9 is the same as the layout shown in FIG. 2, and the contacts are provided to the respective source diffused layers. FIG. 10 shows a layout of metal interconnections (hereinafter referred to as "ground potential interconnections 25") each through which the source potential is supplied. As shown in FIG. 10, the ground potential interconnections 25 are arranged in such a way as to extend in the Y direction. The source potential interconnections (ground potential interconnections 25) are formed after the interconnection 20 for the nodes SN1 and the interconnection 21 for the nodes SN2 in the SRAM cell shown in FIG. 3 are formed.

Figure 11:
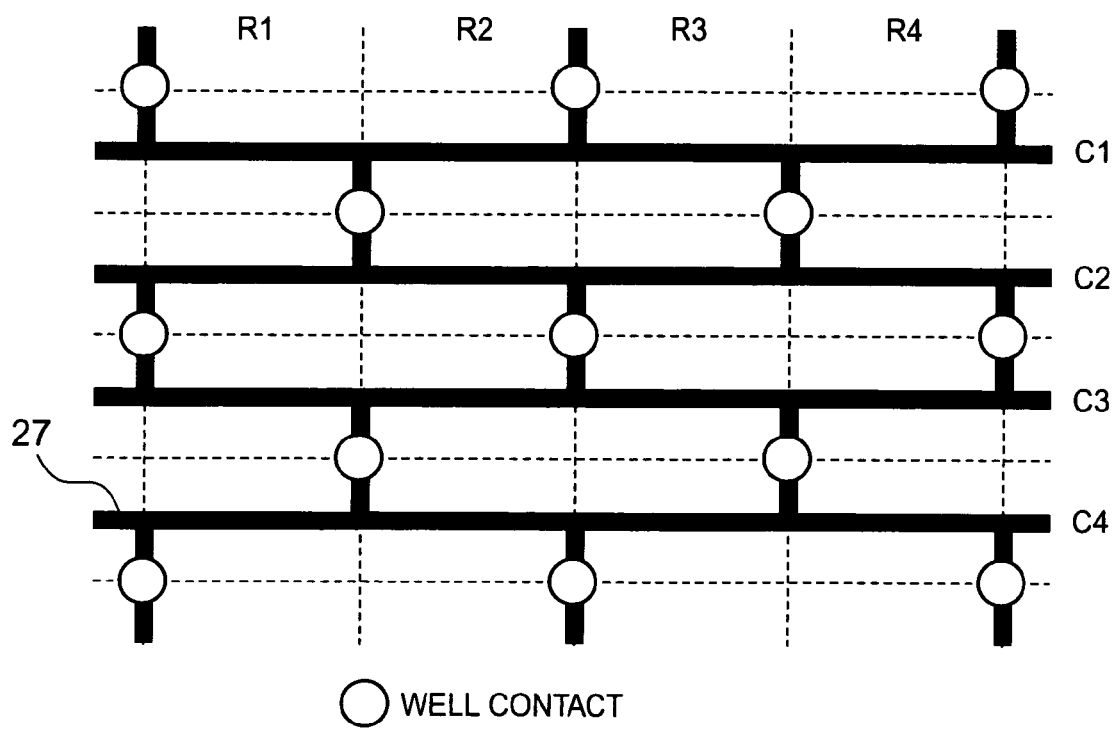
FIG. 11 is a schematic diagram of a layout of well potential interconnections in the SRAM array 1 according to the first exemplary embodiment.

Here, FIG. 11 shows a schematic diagram of a layout showing only how a well potential interconnection 27 according to this exemplary embodiment is arranged. In the example shown in FIG. 11, four SRAM cells are arranged in each of the X and Y directions. In the case of the present embodiment, the well potential interconnection 27 is shaped as follows. The well potential interconnection 27 includes: interconnection parts each linearly extending in the X direction along the center lines of the respective SRAM cells in the Y direction; and interconnection parts, each of which connects together its corresponding interconnection parts each extending in the X direction, and which are parallel to one another in the Y direction. In addition, the interconnection parts which are parallel to one another in the Y direction are connected to the respective well contacts.

Second Exemplary Embodiment

Figure 12:
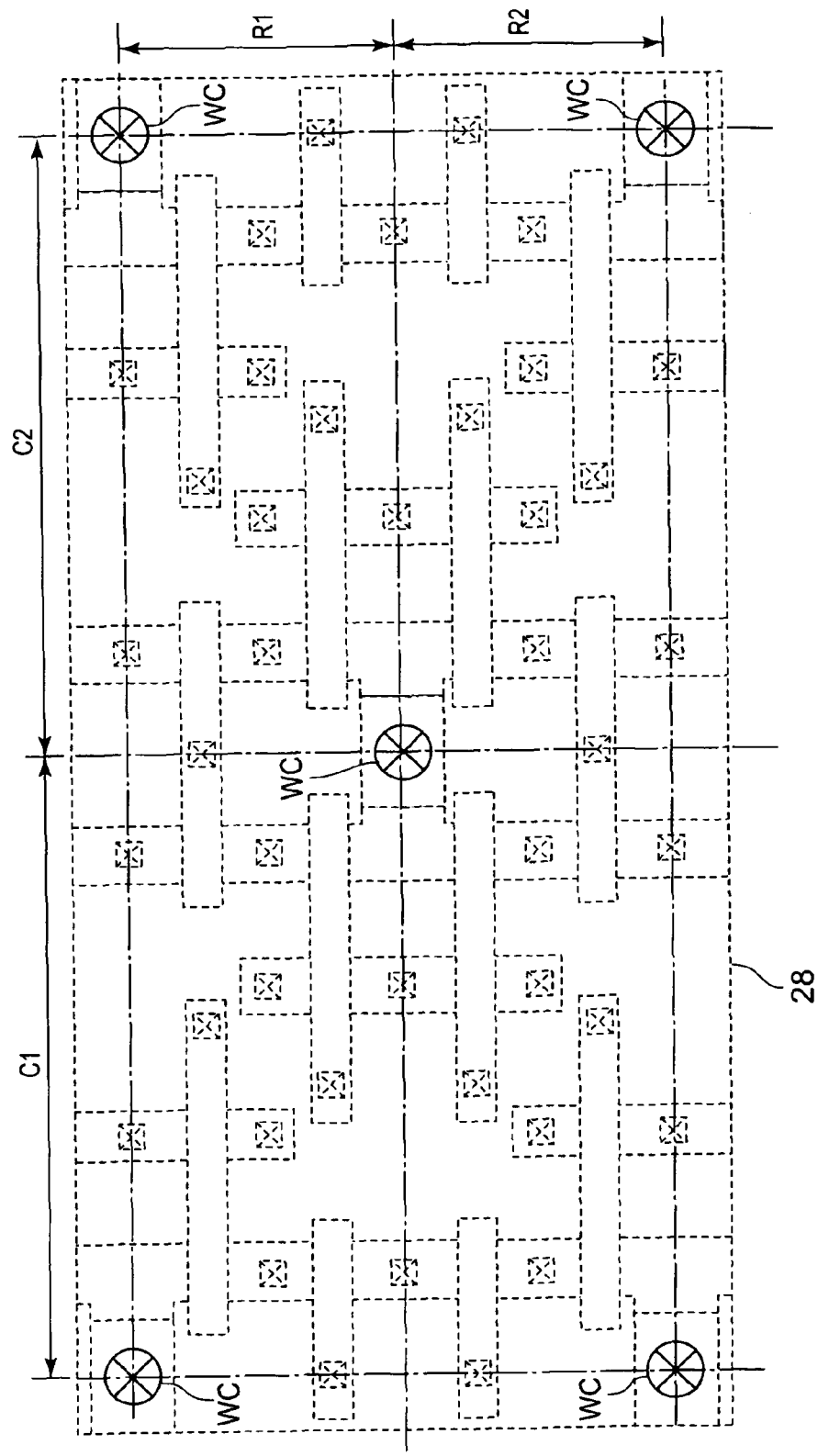
FIG. 12 is a schematic diagram of a layout of a well potential interconnection in an SRAM array according to a second exemplary embodiment.

FIG. 12 shows a schematic diagram of a layout of each SRAM cell according to a second exemplary embodiment.

The second embodiment shows another example of a layout of the well potential interconnection. The second embodiment includes a well potential interconnection 28 formed in such a shape as to cover the SRAM cells. In the case of this exemplary embodiment, the well potential interconnection 28 is configured of an interconnection which is the uppermost among the interconnections existing above the SRAM cells. When the well potential interconnection 28 is thus shaped, the well potential interconnection 28 can be used as a shield interconnection for the SRAM cells. This makes it possible to increase the resistance of each SRAM cell against external noises.

Third Exemplary Embodiment

Figure 13:
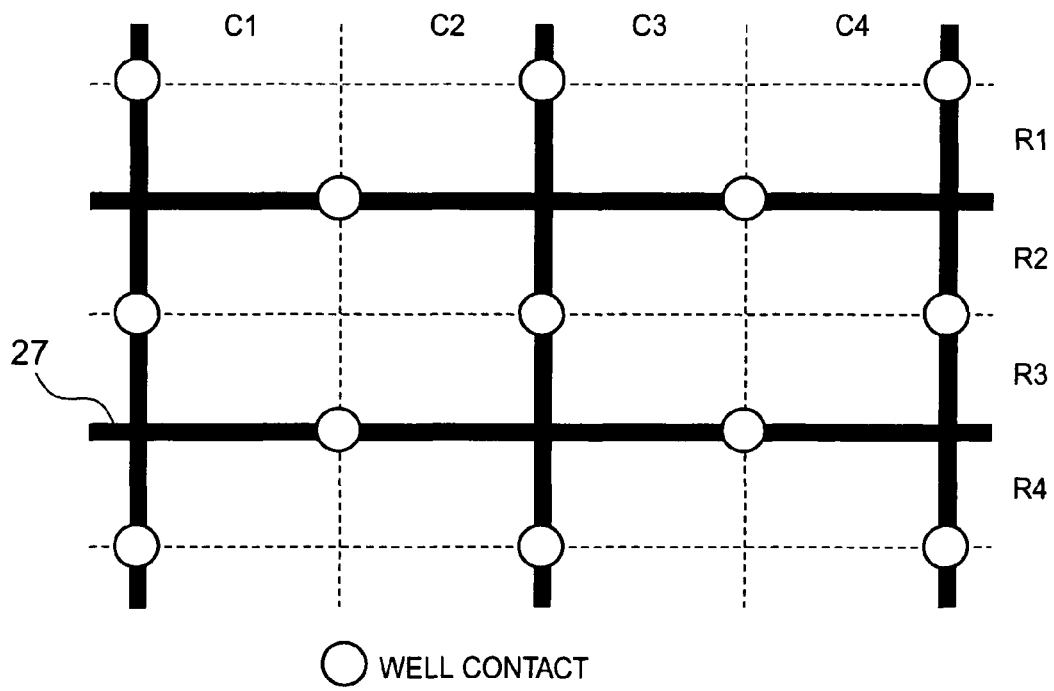
FIG. 13 is a schematic diagram of a layout of well potential interconnections in an SRAM array according to a third exemplary embodiment.
Figure 14:
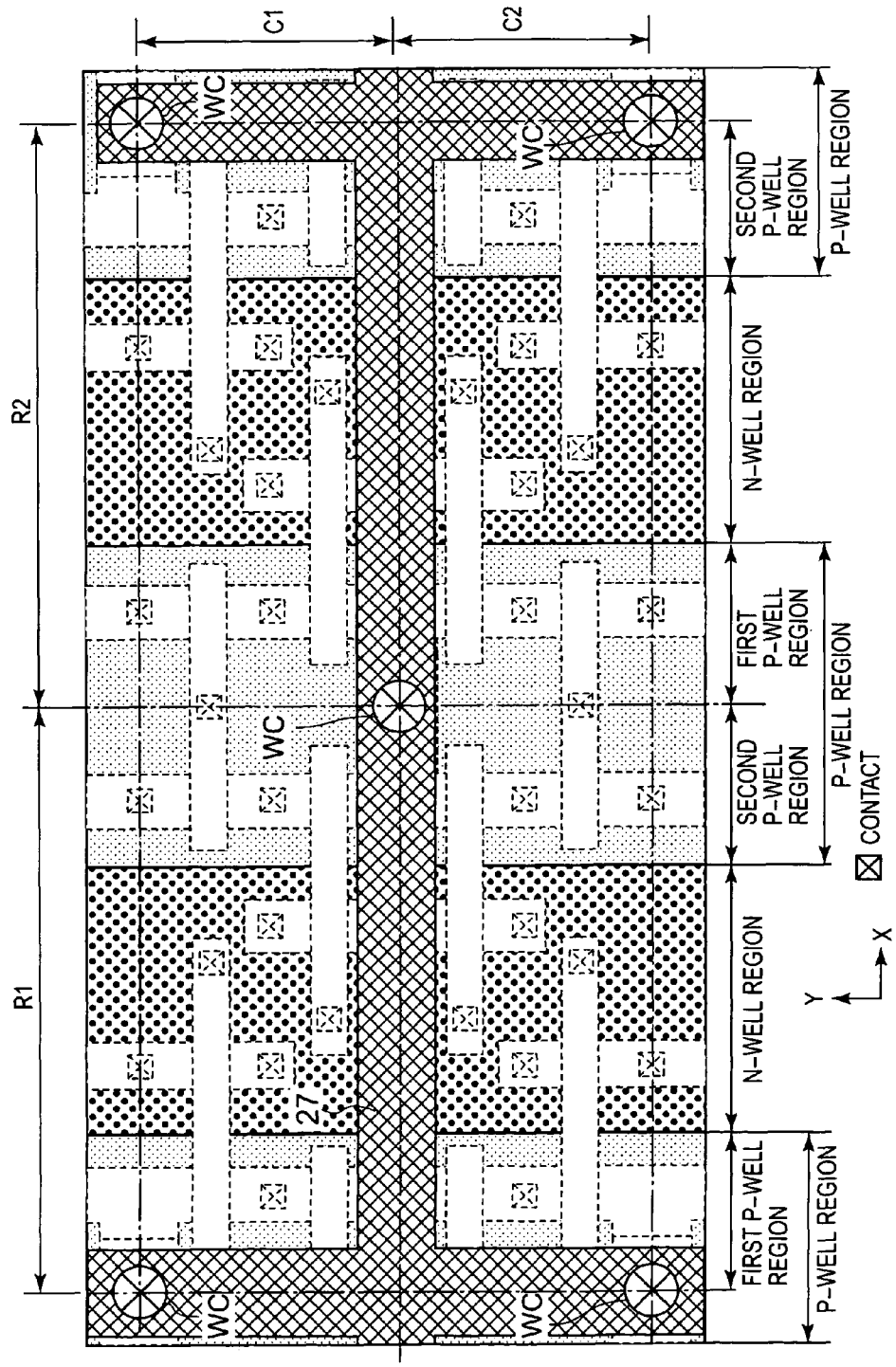
FIG. 14 is a schematic diagram of a detailed layout of the well potential interconnections in the SRAM array according to the third exemplary embodiment.

A third exemplary embodiment shows yet another example of how the well potential interconnections 27 are arranged. FIG. 13 shows a schematic diagram of a layout of the well potential interconnections 27 according to the third embodiment. In the case of the third embodiment, as shown in FIG. 13, the well potential interconnections 27 are arranged along the outer periphery of each four adjoining SRAM cells. In other words, out of the well potential interconnections 27, each interconnection extending in the Y direction is arranged at an interval of each two SRAM cells contiguous to each other in the X direction. In addition, out of the well potential interconnections 27, each interconnection extending in the X direction is arranged at an interval of each two SRAM cells contiguous to each other in the Y direction. Here, FIG. 14 shows a more detailed layout of the well potential interconnections 27. As shown in FIG. 14, the well potential interconnections 27 are arranged in a way that, in each SRAM cell, part of each corresponding interconnection extending in the X direction passes over the boundary between the n-well region of the SRAM cell and the n-well region of an SRAM cell which are contiguous to each other in the Y direction.

When the well potential interconnections 27 are arranged in this manner, it is possible to decrease the area occupied by each well potential interconnections 27 above its corresponding SRAM cells in comparison with the area occupied by each well potential interconnection 27 according to the first exemplary embodiment. This reduces the overlap of the well potential interconnections 27 with the bit lines. For this reason, it is possible to decrease the parasitic capacitance between the well potential interconnections 27 and the bit lines.

Fourth Exemplary Embodiment

Figure 15:
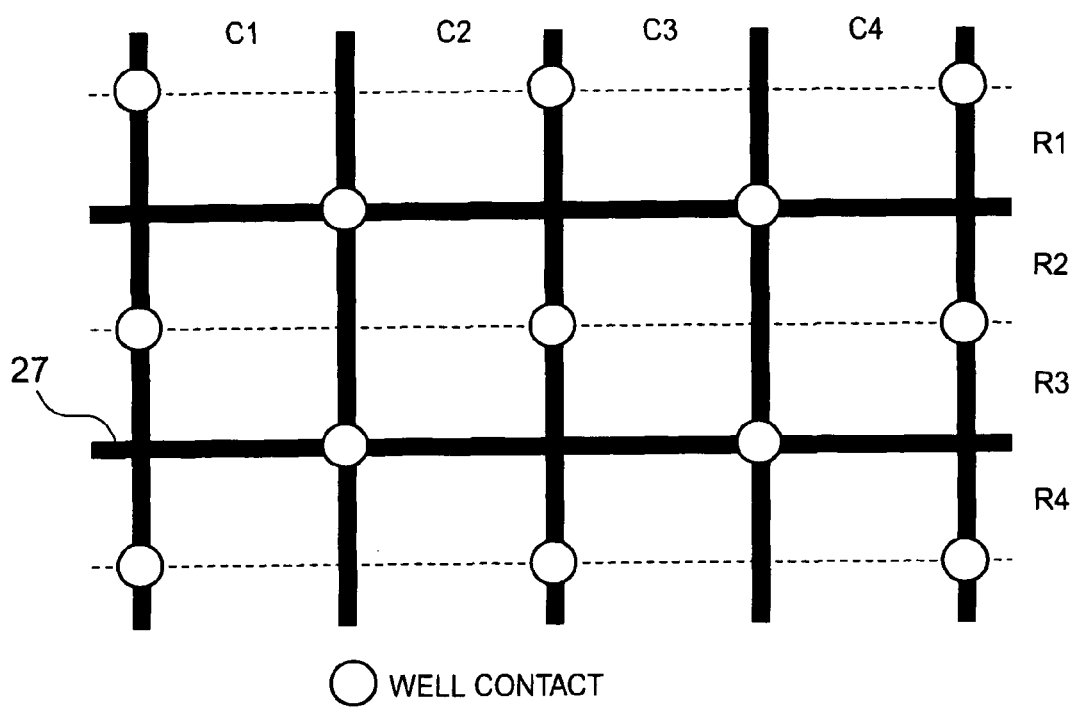
FIG. 15 is a schematic diagram of a layout of well potential interconnections in an SRAM array according to a fourth exemplary embodiment.
Figure 16:
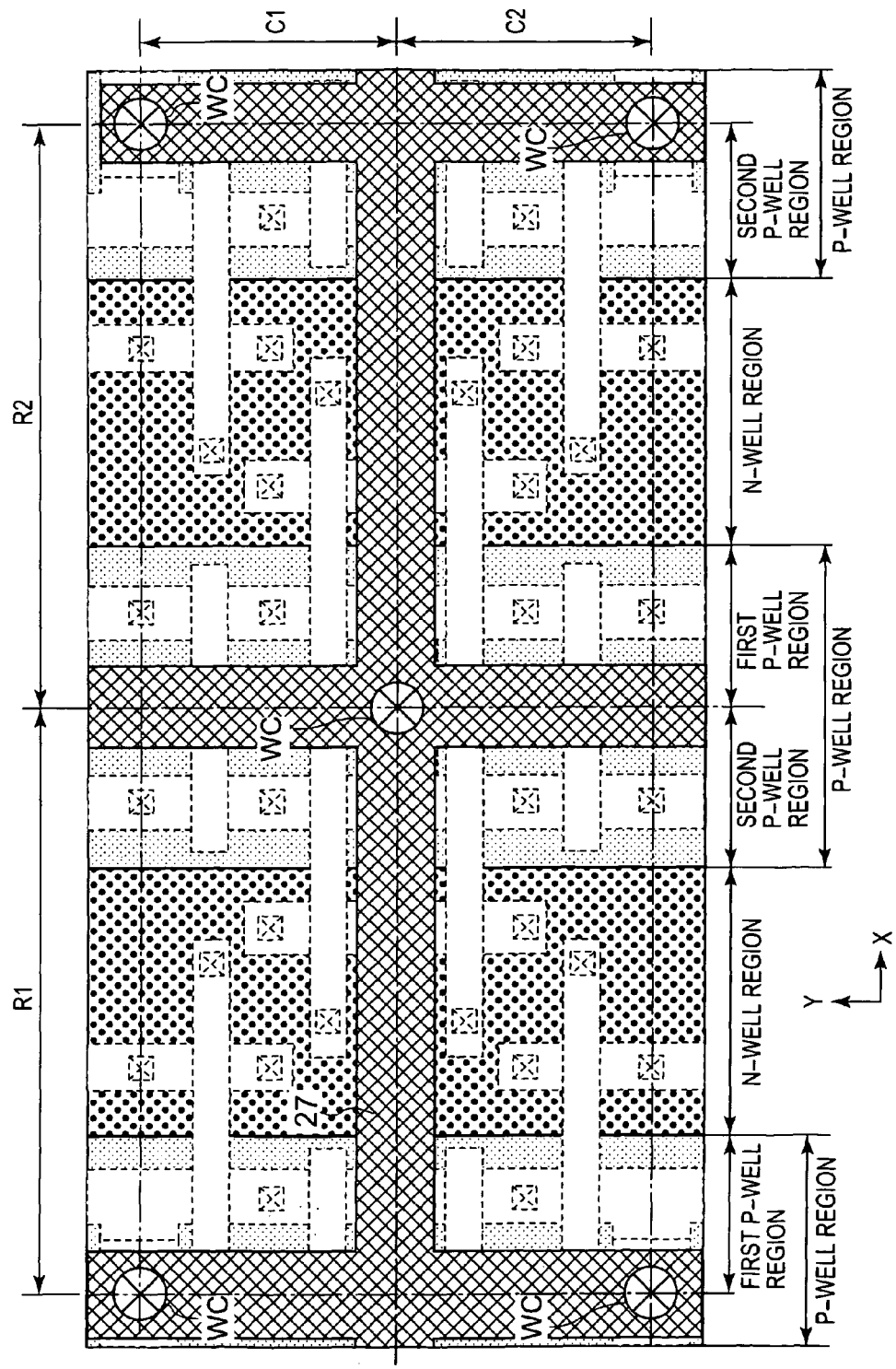
FIG. 16 is a schematic diagram of a detailed layout of the well potential interconnections in the SRAM array according to the fourth exemplary embodiment.
Figure 17:
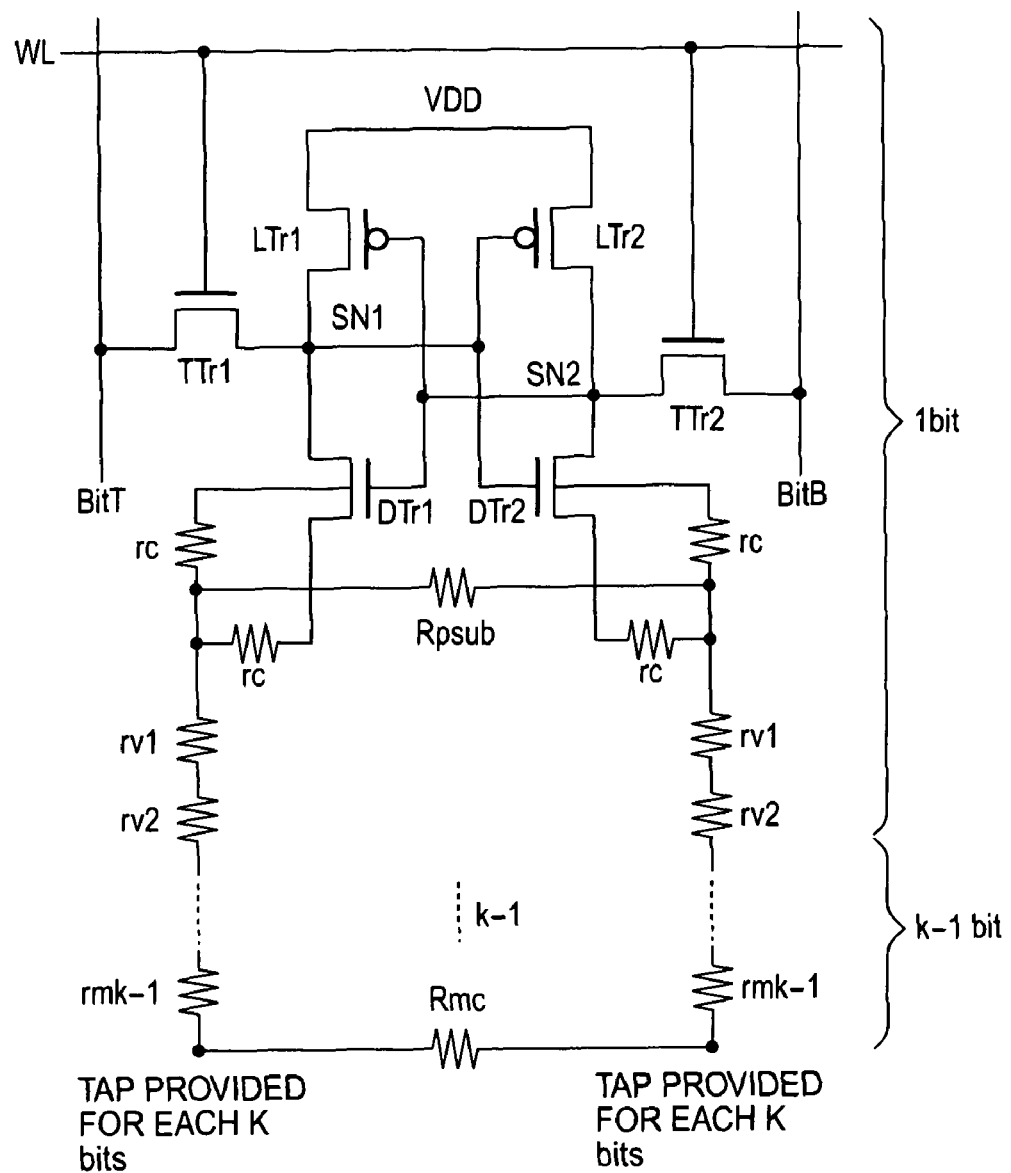
FIG. 17 is an equivalent circuit diagram of an SRAM cell according to Patent Document 1.
Figure 18:
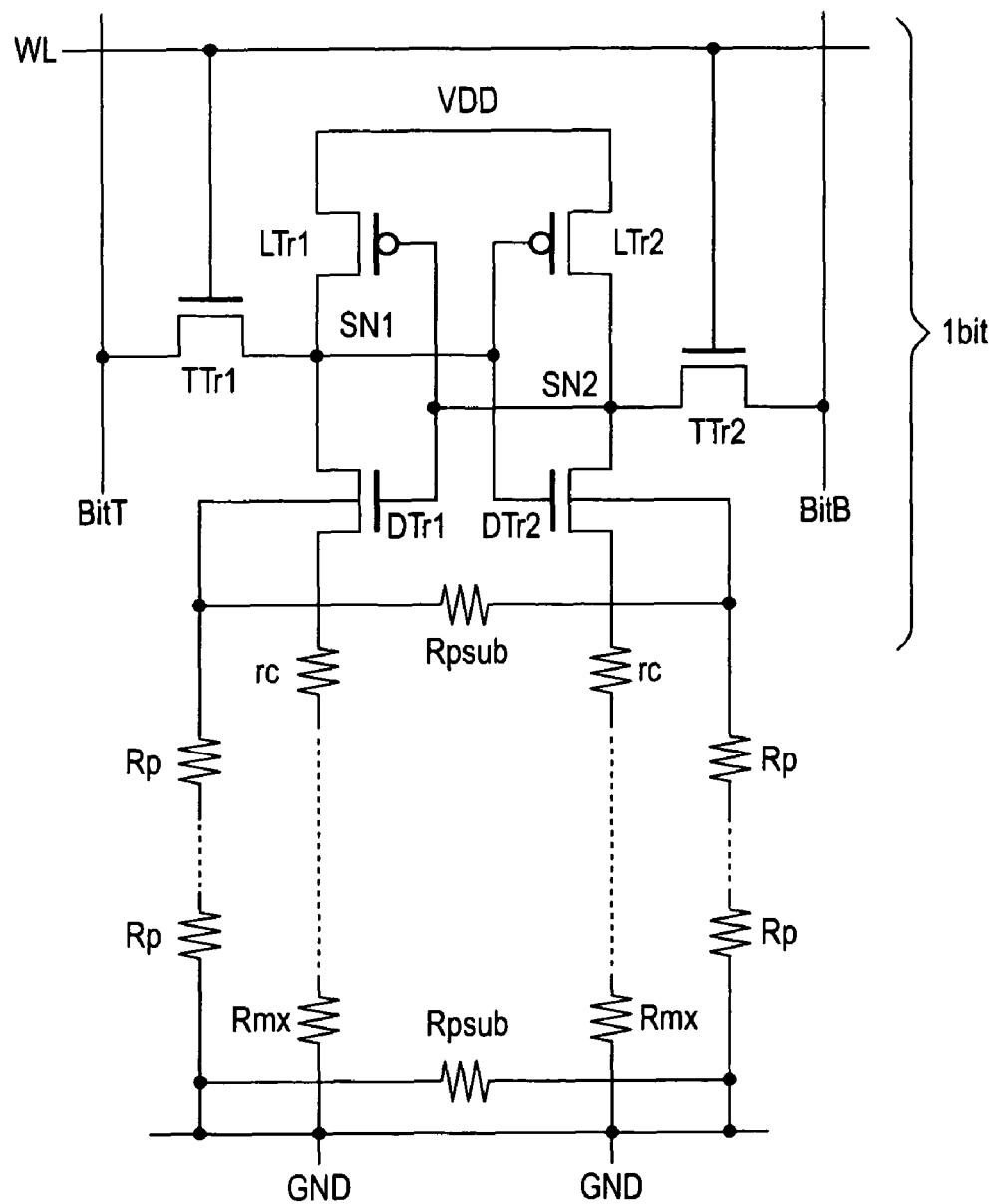
FIG. 18 is an equivalent circuit diagram of an SRAM cell according to Patent Document 2.

A fourth exemplary embodiment shows still another example of how the well potential interconnections 27 are arranged. FIG. 15 shows a schematic diagram of a layout of the well potential interconnections 27 according to the fourth embodiment. In the case of the fourth embodiment, as shown in FIG. 15, the well potential interconnections 27 are arranged along an outer periphery surrounding each two SRAM cells which are contiguous to each other in the Y direction. In other words, out of the well potential intersections 27, each interconnection extending in the Y direction is arranged in the boundary of each SRAM cell. In addition, out of the well potential interconnections 27, each interconnection extending in the X direction is arranged at an interval of each two SRAM cells which are contiguous to each other in the Y direction. In this respect, FIG. 16 shows a more detailed layout of the well potential interconnections 27. As shown in FIG. 16, the well potential interconnections 27 are arranged in a way that, in each SRAM cell, a part of the corresponding interconnection extending in the X direction passes over the boundary between the SRAM cell and an SRAM cell which are contiguous to each other in the Y direction in the n-well region.

This arrangement of the well potential interconnections 27 makes the interconnection density of the well potential interconnections 27 extending in the X direction higher than the arrangement of the well potential interconnections 27 according to the third exemplary embodiment. Because the p-well interconnections are respectively connected to the p-wells extending in the Y direction, the resistance of each p-well is lower. (In the case of the example shown in FIG. 13, no p-well potential interconnection is connected to every other p-well extending in the Y direction.) The length of each p-well interconnection connecting together the two corresponding p-well potential contacts in the case of Embodiment 4 is equal to the length of each p-well interconnection connecting together the two corresponding p-well potential contacts shown in FIG. 13. However, the layout according to Embodiment 4 is capable of making the potential of each p-well region more stable than the layout according to the third exemplary embodiment, and is capable of making the source potential of each driver transistor in each cell more stable than the layout according to the third exemplary embodiment.

Note that the present invention is not limited to the foregoing embodiments, and that the present invention can be modified without departing from the scope or spirit of the present invention whenever deemed necessary. For instance, the layout of the bit interconnections, the layout of the power supply potential interconnections and the layout of the ground potential interconnections, which layouts have been described in the foregoing embodiments are only the examples. These layouts can be changed to other layouts whenever deemed necessary.

Furthermore, the gist of the present invention is that the well regions of the same conductivity type which are formed respectively in different locations are connected together by use of the well potential interconnection passing over the same SRAM cell. For this reason, the locations corresponding to the first p-well region and the second p-well region may be formed as a first and second n-well regions whereas the location corresponding to the n-well region may be formed as a third p-well region. It goes without saying that materials for each interconnection may be chosen depending on the process. Moreover, although the foregoing embodiments have been described by use of the SRAM cells each configured of the 6 CMOS transistors, the number of transistors included in each SRAM cell may be 7, 8 or more. It goes without saying that, as the number of transistors increases, and as the area of each cell increases, the effects which the present invention has on the stability of the operations of each cell and on the increase in the soft error resistance thereof become more conspicuous.

Further, it is noted that Applicant's intent is to encompass equivalents of all claim elements, even if amended later during prosecution.

What is claimed is:

1. A semiconductor integrated circuit device including static random access memory (SRAM) cells, each comprising:
   a first p-well region in which a first transfer transistor and a first driver transistor are formed;
   a second p-well region in which a second transfer transistor and a second driver transistor are formed;
   an n-well region which is located between the first p-well region and the second p-well region, and in which a first load transistor and a second load transistor are formed, the first load transistor being connected between a power supply potential interconnection and the first driver transistor, and the second load transistor being connected between the power supply potential interconnection and the second driver transistor;
   a first tap p-diffused layer for supplying a potential to the first p-well region; and
   a second tap p-diffused layer for supplying the potential to the second p-well region,
   wherein the first and second tap p-diff-used layers are arranged substantially symmetrical with respect to a center of a layout of the SRAM cell, and the first and second tap p-diffused layers are connected to each other with a first metal interconnection, at least a part of which passes over the n-well region in the SRAM cell.

2. The semiconductor integrated circuit device according to claim 1, wherein the first and second tap p-diffused layers are arranged substantially on a diagonal line in the layout of the SRAM cell.

3. The semiconductor integrated circuit device according to claim 1, wherein each of the first tap p-diffused layer and the second tap p-diffused layer is arranged at an intersection point of boundaries of four corresponding SRAM cells, one of which adjoins the others.

4. The semiconductor integrated circuit device according to claim 1, further comprising a second metal interconnection for connecting gate electrodes respectively of the first and second transfer transistors,
   wherein, above the n-well region, the first metal interconnection and the second metal interconnection both extend in a first direction in which well regions of the different conductivity types are arranged alternately.

5. The semiconductor integrated circuit device according to claim 4,
   wherein the first and second metal interconnections are formed with an insulating film interposed therebetween, the first metal interconnection constituting the upper layer, and the second metal interconnection constituting the lower layer, and
   wherein the first and second metal interconnections are arranged in an substantially same location above the n-well region in a plan view.

6. The semiconductor integrated circuit device according to claim 1, wherein a first bit line connected to the first transfer transistor and a second bit line connected to the second transfer transistor both extend in a second direction orthogonal to a first direction in which well regions of the different conductivity types are arranged alternately.

7. The semiconductor integrated circuit device according to claim 1, wherein the power supply potential interconnection extends in a second direction orthogonal to a first direction in which well regions of the different conductivity types are arranged alternately.

8. The semiconductor integrated circuit device according to claim 1,
   wherein ends of the first driver transistor and the second driver transistor are connected to corresponding source potential interconnections, and
   wherein the source potential interconnections comprises metal interconnections formed in a step different from a step in which the first metal interconnection is formed.

9. The semiconductor integrated circuit device according to claim 8, wherein the source potential interconnections both extend in a second direction orthogonal to a first direction in which well regions of the different conductivity types are arranged alternately.

10. The semiconductor integrated circuit device according to claim 1, wherein a source diffused layer of the first driver transistor and the first tap p-diffused layer are formed in a location where the source diffused layer of the first driver transistor and the first tap p-diffused layer are in contact with each other, and a source diffused layer of the second driver transistor and the second tap p-diffused layer are formed in a location where the source diffused layer of the second driver transistor and the second tap p-diffused layer are in contact with each other, and wherein a silicide layer is formed on surfaces of the source diffused layer of the first driver transistor and the first tap p-diffused layer, and on surfaces of the source diff-used layer of the second driver transistor and the second tap p-diffused layer.

11. The semiconductor integrated circuit device according to claim 1, further comprising a second metal interconnection for connecting together gate electrodes respectively of the first and second transfer transistors, wherein, above the n-well region, the first and second metal interconnections both extend in a first direction in which the well regions of the different conductivity types are arranged alternately; and wherein the power supply potential interconnection, and source potential interconnections all extend in a second direction orthogonal to a first direction in which well regions of the different conductivity types are arranged alternately.

12. The semiconductor integrated circuit device according to claim 1, wherein the first metal interconnection is formed in a layer different from a layer in which first and second bit lines and the power supply potential interconnection are formed.

13. The semiconductor integrated circuit device according to claim 1, wherein the first metal interconnection is formed in a layer above a layer in which first and second bit lines as well as the power supply potential interconnection are formed, and wherein the first metal interconnection includes interconnections which extend in a second direction orthogonal to a first direction in which well regions of the different conductivity types are arranged alternately.

14. The semiconductor integrated circuit device according to claim 1, wherein any one of the first metal interconnection and source potential interconnections is formed in such a way as to cover substantially an entire region of the SRAM cell.

15. The semiconductor integrated circuit device according to claim 1, wherein the first metal interconnection is formed in a shape along an outer periphery of each two SRAM cells contiguous to each other in a second direction orthogonal to a first direction in which the well regions of the different conductivity types are arranged alternately.

16. The semiconductor integrated circuit device according to claim 1, wherein the first metal interconnection is formed in a shape along an outer periphery of each four SRAM cells contiguous to each other in a first direction in which the well regions of the different conductivity types are arranged alternately, and in a second direction orthogonal to the first direction in which the well regions of the different conductivity types are arranged alternately.

* * * * *